(12) United States Patent
Kreutzer et al.

(10) Patent No.: US 7,995,356 B2
(45) Date of Patent: Aug. 9, 2011

(54) POWER SEMICONDUCTOR MODULE COMPRISING LOAD CONNECTION ELEMENTS APPLIED TO CIRCUIT CARRIERS

(75) Inventors: Rainer Kreutzer, Weiden (DE); Karl-Heinz Schaller, Ursensollen (DE)

(73) Assignee: Siemens Aktiengesellschaft, Munich (DE)

( * ) Notice: Subject to any disclaimer, the term of this patent is extended or adjusted under 35 U.S.C. 154(b) by 648 days.

(21) Appl. No.: 11/990,928

(22) PCT Filed: Aug. 26, 2005

(86) PCT No.: PCT/DE2005/001505
§ 371 (c)(1), (2), (4) Date: May 5, 2008

(87) PCT Pub. No.: WO2007/025489
PCT Pub. Date: Mar. 8, 2007

(65) Prior Publication Data
US 2009/0109645 A1 Apr. 30, 2009

(51) Int. Cl.
*H05K 7/00* (2006.01)
(52) U.S. Cl. ........ 361/820; 257/678; 257/398; 361/728; 361/730; 361/752
(58) Field of Classification Search .................. 361/820, 361/728, 730, 752; 257/678
See application file for complete search history.

(56) References Cited

U.S. PATENT DOCUMENTS

| | | | | |
|---|---|---|---|---|
| 1,607,424 A | * | 11/1926 | Austin | 174/75 R |
| 3,199,068 A | * | 8/1965 | Neenan | 439/488 |
| 4,499,485 A | * | 2/1985 | Schierz et al. | 257/726 |
| 4,710,795 A | * | 12/1987 | Nippert et al. | 257/692 |
| 5,316,507 A | * | 5/1994 | Capp | 439/886 |
| 5,408,128 A | * | 4/1995 | Furnival | 257/690 |
| 5,744,860 A | * | 4/1998 | Bayerer | 257/683 |
| 5,879,176 A | * | 3/1999 | Stimson | 439/188 |
| 5,942,797 A | * | 8/1999 | Terasawa | 257/723 |
| 6,297,549 B1 | * | 10/2001 | Hiyoshi | 257/703 |
| 6,421,244 B1 | * | 7/2002 | Shinohara et al. | 361/736 |
| 6,483,128 B2 | | 11/2002 | Loddenkotter et al. | |
| 6,532,157 B1 | * | 3/2003 | Glenn et al. | 361/767 |
| 6,802,745 B2 | * | 10/2004 | Loddenkoetter | 439/709 |
| 6,828,600 B2 | * | 12/2004 | Lenniger et al. | 257/181 |
| 6,873,042 B2 | * | 3/2005 | Ishii et al. | 257/702 |
| 6,923,692 B2 | * | 8/2005 | Niebauer | 439/886 |
| 6,982,482 B2 | * | 1/2006 | Glidden et al. | 257/723 |
| 2003/0168724 A1 | * | 9/2003 | Lenniger et al. | 257/684 |

(Continued)

FOREIGN PATENT DOCUMENTS

DE 36 04 313 A 8/1987

(Continued)

*Primary Examiner* — T C Patel
*Assistant Examiner* — Nathan Milakovich
(74) *Attorney, Agent, or Firm* — Harness, Dickey & Pierce, P.L.C.

(57) ABSTRACT

A power semiconductor module is disclosed including a housing for receiving at least one essentially board-type circuit carrier, the circuit carrier being provided with a metallization on at least one part of its surface and being populated with and electrically connected to at least one power semiconductor, rigid, integral and essentially straight load connection elements being applied on the metallized part of the metallized surface of the circuit carrier, which load connection elements are electrically and mechanically fixedly connected to the circuit carrier by one of their ends and project essentially perpendicularly into the housing interior, separate connection terminal elements for electrical conduct-making being placed onto the free end of the load connection elements.

17 Claims, 3 Drawing Sheets

U.S. PATENT DOCUMENTS

2004/0159940 A1 * 8/2004 Hiyoshi .................. 257/732

FOREIGN PATENT DOCUMENTS

| | | |
|---|---|---|
| DE | 36 43 288 | 6/1988 |
| DE | 44 07 810 A1 | 9/1995 |
| DE | 197 19 703 | 11/1998 |
| DE | 19907427 | 9/1999 |
| DE | 199 14 741 | 10/2000 |
| DE | 100 08 572 A1 | 9/2001 |
| DE | 10047126 | 5/2002 |
| DE | 10200372 | 7/2003 |
| DE | 103 45 768 A1 | 5/2005 |
| EP | 103880 A2 * | 3/1984 |
| EP | 0 150 347 A1 | 8/1985 |
| EP | 1465250 A1 * | 10/2004 |
| EP | 1 494 279 A1 | 1/2005 |
| JP | 09 283681 A | 10/1997 |
| JP | 09 321216 A | 12/1997 |

* cited by examiner

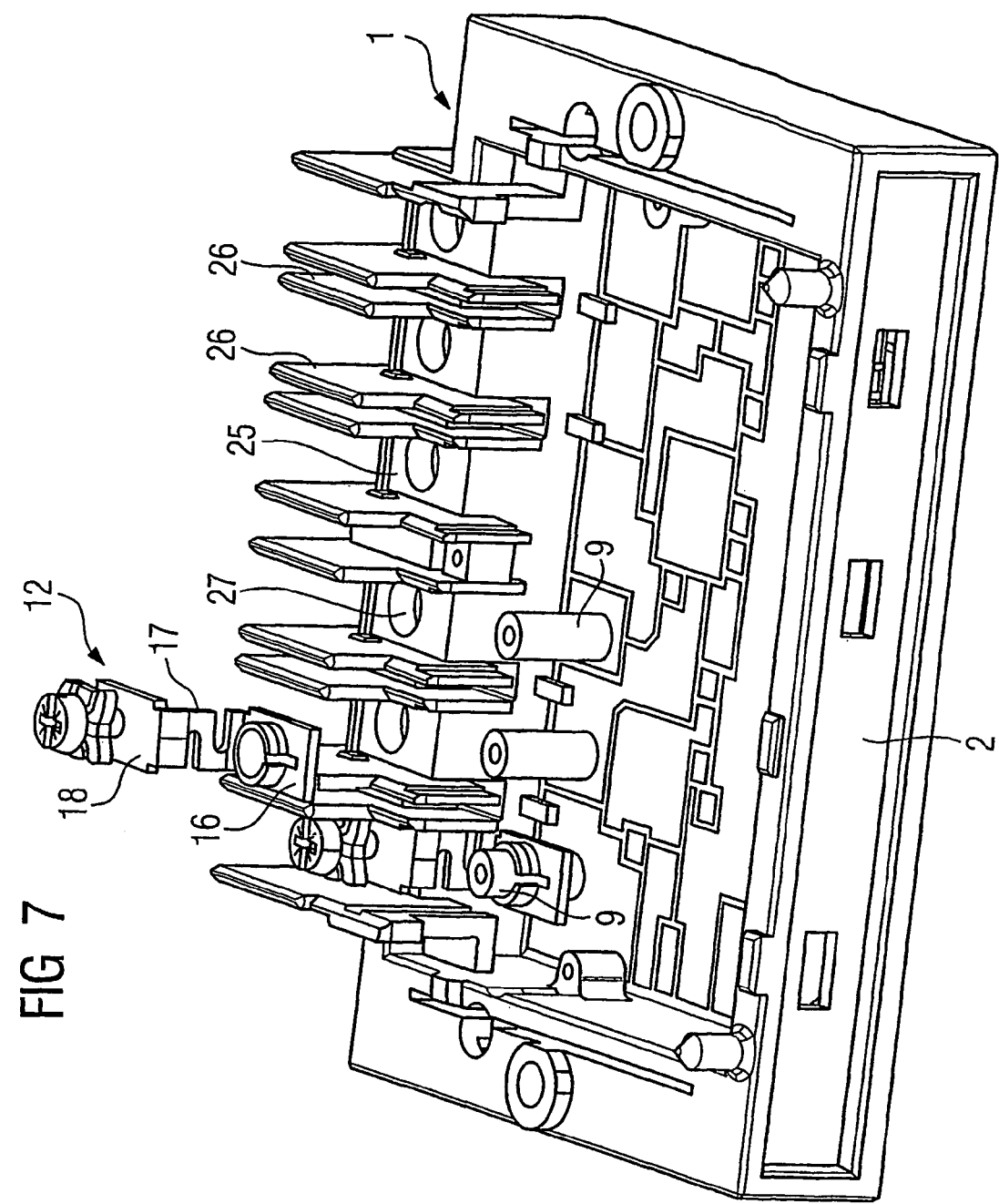
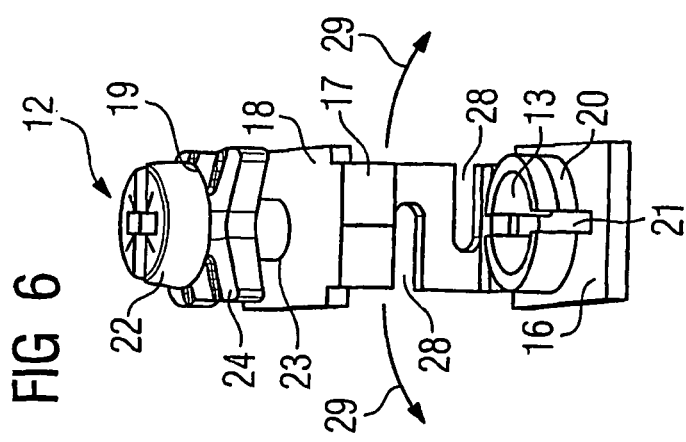
FIG 7
FIG 6

POWER SEMICONDUCTOR MODULE COMPRISING LOAD CONNECTION ELEMENTS APPLIED TO CIRCUIT CARRIERS

PRIORITY STATEMENT

This application is the national phase under 35 U.S.C. §371 of PCT International Application No. PCT/DE2005/001505 which has an International filing date of Aug. 26, 2005, which designated the United States of America, the entire contents of which are hereby incorporated herein by reference.

FIELD

At least one embodiment of the invention generally relates to a power semiconductor module. At least one embodiment of the invention also generally relates to a housing for a power semiconductor module.

BACKGROUND

Power semiconductor modules require load current connections, which are passed to the outside, as an external interface for making electrical contact with the modules. In this case, depending on the power levels, external connections with relatively large cross sections may occur, and there is therefore a requirement for the load current connections to be highly robust. There is also a need to equip the load current connections with different conductor connecting contours, so that different cables or rail systems can be connected as required. On the side within the module, the load current connections must be electrically and mechanically connected to a less robust circuit mount, which is inserted in a housing, in general a plastic housing, and is fitted with components, in particular power semiconductors.

In this case, because of the high thermal conductivity and thermal coefficients of expansion of ceramic circuit mounts, so-called DCB (Direct Copper Bonded) substrates are preferably used for power semiconductors, which are composed of a ceramic insulator (aluminum oxide or aluminum nitride) on which a thin layer of pure copper is applied so that it adheres strongly. In particular, the high thermal conductivity together with the high thermal capacity and heat spreading of the copper coating and a coefficient of thermal expansion of the DCB substrate close to that of silicon make DCB substrates virtually indispensable for power electronics, despite their disadvantages in terms of robustness. When so-called naked semiconductor chips are mounted directly on the circuit mount, the electrical connection between the semiconductor chips and the circuit mount is normally made by bonding by means of thin Al or AG wires.

The electrical connection from the circuit mounted to the external load current connection is made using the same connecting technique. This admittedly results in a certain amount of mechanical decoupling between the load current connection and the circuit mount but, in principle, the different longitudinal coefficients of expansion of Al bonding wire ($23*10^{-6}$) and DCB ($7*10^{-7}$) result in restrictions in temperature life tests, since bonding wires may become detached. In any case, however, the introduction of large conductor connecting forces to the circuit mount should be avoided, and a permanent connection should be ensured between the circuit mount and the load current connection.

It is known from DE 197 19 703 for outer load current connections which project outwards to be injection molded in the module housing, with specific tabs in the load connecting conductor providing additional anchorage, since the shrinkage which occurs when the plastic housing cools down after the injection process means that the load connections are often not firmly anchored, at least not permanently. In this case, the connection between the circuit mount and the injection-molded load connections is made by bonding.

In this context, DE 199 14 741 likewise proposes load connecting elements which are connected to the inner wall of the housing and have bonding surfaces at their lower end. In this case as well, the connection between the respective load connecting element and the circuit mount is made by bonding wires. The types of connection described above both require bonding in the housing. An appropriate free space must be provided for the bonding tool in the housing for this purpose, and this has a disadvantageous effect on the module size, particularly in the case of small modules, since this space must be taken into account.

As mentioned, the circuit mounts are coated with copper, although, depending on the bonding wires that are used, surfaces (pads) which can be bonded and are composed of aluminum, nickel, copper or gold are required at the bonding connecting points for the bonding process, for which purpose the copper of the circuit mount is generally highly suitable. In some cases, the circuit mounts must, however, be provided with bonding pads. The load connecting elements themselves are in general produced in solid form from copper or brass and disadvantageously likewise require surfaces which can be bonded. Furthermore, depending on the current load, different bonding wire diameters are often required for DCB circuit connections between the components on the one hand and the circuit connection to the load connecting elements on the other hand. This involves an additional process step and cost disadvantages.

DE 36 43 288 describes various load connecting techniques. On the one hand, a current connecting bolt is described which is fitted to the circuit mount and is connected via a cross member and two screw connections to a mount body on the housing rim. A further connection from the mount body to the exterior is made possible by a separate screwed conductor element. Elsewhere, DE 36 43 288 describes a leaf spring element which is screwed on one side to a separate mount body, or a mount body which is integrated in the housing, and rests in a sprung manner on the circuit mount on the other side, making electrical contact. A further connection from the mount body located in the housing to the exterior is made possible by a separate conductor element, which is likewise screwed to the mount body. The large number of elements used and the need for multiple screw connections in these connecting techniques must have a disadvantageous effect on the production costs.

Another embodiment discloses a leaf spring element which has a cylindrical attachment, for engaging in the housing cover, on one side. When the housing cover is fitted, a contact pressure is exerted on the circuit mount. This may have the disadvantage that the contact is made only when the housing cover is closed. Furthermore, handling problems can be expected because of the fitting of the housing cover. A further disadvantage of this solution is that the area required on the circuit mount is comparatively large, and that the leaf spring occupies a comparatively large amount of space in the housing in this arrangement.

The latter could lead to space problems, and therefore to disadvantages, particularly when further discrete components of a higher type are fitted. Solutions based on leaf springs may be problematic overall in the event of incorrect sizes being used, especially when subject to increased shock and vibration loads.

SUMMARY

In at least one embodiment of the invention, a power semiconductor module is disclosed which allows a simple, long-life, cost-effective and flexible load connecting technique. A further object is, in particular, not to transmit the forces and torques which act from the outside on the connections to the connections of the circuit mount.

According to at least one embodiment of the invention, rigid, integral and essentially straight load-connecting elements are fitted on the metallized part of the metallized surface of the circuit mount, are electrically and mechanically firmly connected to the circuit mount and project essentially at right angles into the housing interior, with separate connecting terminal elements for making electrical contact being fitted to the free end of the load connecting elements.

The load connecting elements are advantageously and easily fitted directly to the generally copper metallization on the circuit mount, where they are firmly and rigidly connected electrically and mechanically to the circuit mount. The load connecting element is essentially straight and projects virtually at right angles to the circuit mount into the housing interior. The load connecting elements are integral, and there is no need to connect a plurality of connection elements to a connection which then also has to be supplied outside the housing. The circuit mount can highly advantageously be completely fitted separately, electrically connected, and then introduced into the housing as a unit.

The abovementioned electrical and mechanically firm connection of the load connecting elements to the circuit mount excludes bonding as a connection technique. There is advantageously therefore no need to plan for any free space for bonding tools in the housing, either, and the overall housing can if required be designed to be more compact. This therefore also means that there is no need for the widely required separate process step for bonding for the connection from the circuit mount to the load connecting element.

In many applications, it is even possible to dispense entirely with bonding and therefore, possibly, with the complete bonding apparatus. There is then also no need for special bonding pads formed from coatings of aluminum, nickel, copper or gold on the circuit mount, and the load current element can be applied directly to the generally copper metallization of the circuit mount surface. Furthermore, in some applications, there is no need for protective layers (for example soft casting) of oxidation protection on the bonding connection points. A functional test covering the entire module can be carried out before installation in the housing. No further work is required on the circuit mount after introduction into the housing.

In one example embodiment, the load connecting element is in the form of a cylinder or tube and may have different base surface geometries. By way of example, circular, oval or polygonal base surface geometries are feasible, as well as others. Load current elements with one of the above-mentioned base surface geometries may either be in the form of a solid cylinder or else may be tubular, that is to say they may be in the form of a hollow cylinder with any desired wall thickness.

Furthermore, rod-like load current elements may be used with base surface geometries with different profiles (for example U-profiles, T-profiles). This highly advantageously allows the sizes of the load current elements to be matched to their specific requirements. Specific requirements such as these may result from mechanical requirements such as stiffness, life, contact area on the circuit mount, from electrical requirements such as the current carrying capability or conductivity, or else from production-relevant requirements such as economic machining capability. A tubular load connecting element is advantageous because of the known skin effect and the displacement of the current distribution to the surface of the conductor, particularly when high-frequency currents are applied to the conductor.

In one example embodiment, the base surface of the load connecting element is fitted in a free-standing form to the circuit mount by means of different types of connection, such as soldering, adhesive bonding or welding.

Soldered joints are often required in any case on the circuit mount, for example either because the semiconductor component is fitted in a wiring mount and not as a naked chip, or because the circuit mount is intended to hold other circuitry components for external circuitry. In this case, the load current elements can be soldered on in an automated form in the same process as the other soldering processes. There is therefore no need for any additional tools or machines.

In this case, the size and/or base surface of the load current element must be chosen such that they are positioned in a stable and free form on the circuit mount after being fitted, without any further holding apparatus, and cannot be tilted or rotated by the solder contact during transportation. In this case, the contact means may be fitted using any known process (dispensing, mask pressure, etc.). The load connecting elements are suitable for automatic placement as a poured item or goods in the form of strips, using existing chip placement systems. If a tubular load connecting element is used, then the solder can advantageously be arranged, depending on the shape of the load connecting element, such that the liquefied solder centers the tubular load connecting element, by the capillary and wetting force, on reaching the soldering temperature and the solder is distributed correctly onto the inner and outer casing surface of the body. The positioning accuracy is achieved by uniform distribution of the solder in all directions, and further positioning tolerances can be taken into account in the design via the housing or the circuit mount.

In a further advantageous embodiment of the invention, that end of the load connecting element which is not soldered and is free projects with an overhang through the housing outwards, where it is intended to hold a connecting terminal element for making electrical contact. An appropriate cutout can be provided for this purpose in the housing, and is preferably of the same shape as the free end of the load connecting element. It is advantageous to incorporate these cutouts in the housing cover, for easy handling capability. When the cover is fitted, this advantageously results in further retention for the load connecting element, and it can now not be separated from the circuit mount.

In a further embodiment, the load connecting element is formed from a ceramic body with electrically conductively metallized casing surfaces. The outer and inner casing surfaces (in the case of a tubular load connecting element) will preferably have copper metallization. This means that there is no need for solid load connecting elements composed of copper or brass. Since, in general, the circuit mount is likewise composed of ceramic, this makes it possible to avoid mechanical stresses resulting from different coefficients of expansion, and this in turn has an advantageous effect on the life of the power semiconductor module.

In a further variant, the metallized casing surface is highly resistant to wear, particularly in the section where the connecting terminal elements are fitted. In particular, it has been found advantageous to use a palladium coating. Good wear resistance in this section is particularly advantageous when the connecting terminal element is fitted and removed repeatedly.

In a further advantageous variant, the connecting terminal element has a cutout (inter alia a blind hole, hole, aperture) whose geometry and size correspond approximately to the base surface geometry and size of the free end of the corresponding load connecting element to be connected. The cutout in the connecting terminal element is placed over the free end of the projecting load connecting element. In this case, the size and shape of the cutout can advantageously be chosen so as to create a force-fitting connection between the connecting terminal element and the load connecting element which adheres well because of the friction forces and offers a good electrical contact between the two elements. This allows the connecting terminal elements to be fitted after complete assembly of the housing. There is no need for screw connection of the connecting terminal and load connecting element.

In a further refinement of an example embodiment, in the holding area for the load connecting element, the connecting terminal element has means which allow slight springing-back enlargement of the internal diameter of the cutout for fitting to the load connecting element, with the forces which occur in the widened area as a result of the springing-back characteristic increasing the force fit of the connection between the connecting terminal element and the load connecting element. If the cutout is a hole and if the hole is open on its circumference by a slot, this results, for example because of the material structure, in a whole opening which can be widened slightly and, when in the widened state, can be plugged over the overhang, which is in the form of a pin, of the load connecting element.

The springing-back characteristic of the material structure will result in improved adhesion and contact with the load connecting element. This allows the connecting terminal element to be connected to the load connecting element without a large amount of force being applied in the direction of the circuit mount surface. In this case, the above-mentioned embodiments represent only examples, and further variants are feasible which make use of the abovementioned fundamental principle.

In one example embodiment, the housing and connecting terminal element are designed such that the connecting terminal element can be connected to the housing with an interlock and/or with a force fit in order to absorb force and torque from externally introduced forces, such that the forces which are introduced are essentially transmitted to the housing. By way of example, screw connections or adhesively bonded connections can be provided between the housing and the connecting terminal element in order to produce an interlocking connection.

In another variant, the connecting terminal elements may even be injection molded in the housing cover. In another force-fitting connection, for example, walls are fitted to the housing, with a connecting terminal element being pushed with an accurate fit between such walls and therefore preventing rotation on the plane of the housing surface. Other connection variants include, for example, slots, grooves, tabs in the housing, depressions in the housing into which the terminal connecting element can be pressed, pushed or clicked. Furthermore, interlocking and force-fitting connection variants can be combined as required, and are governed by the installation conditions. Externally introduced forces and torques can therefore advantageously be transmitted to the housing.

In a further advantageous example embodiment, the connecting terminal element has devices which ensure a torsionally soft connection between the outer rail sections of the connecting terminal element. By way of example, devices such as these may be material cutouts preferably in the area of the central rail section which, when a torsional force to the left or the right occurs on the external connection, lead to slight rotational deflection in this section, and therefore absorb a portion of the force that has been introduced. The deflection is cancelled out by the springing-back characteristic of the material as soon as the external torsional force is no longer applied. The maximum torsional force which can be introduced to the connecting terminal element can advantageously be governed by the maximum rotational deflection, and may correspond to this. In this case, the maximum torsional force which can be introduced is indicated by the maximum rotational deflection.

A connection can furthermore advantageously be formed between the housing and the connecting terminal element, and is detachable again. This allows various connecting terminal elements to be installed and therefore to be flexibly adapted to the connecting technique, connecting areas and position of the connections in the structure.

In one particularly advantageous example embodiment, on its external conductor connecting side, the connecting terminal element has a holding device in the form of various, differently configured holes and/or contours, which allow flexible connection of normal external connections, using various connecting techniques. In this case, there is no need to replace connecting terminal elements, thus ensuring the maximum possible flexibility. For example, contours such as these may at the same time be connecting surfaces rotated through 90°, with a hole or screw connections. Furthermore, for example, contours are possible which ensure that external connecting conductors are clamped in after being inserted (pinch connection).

BRIEF DESCRIPTION OF THE DRAWINGS

Example embodiments of the invention will be explained in more detail in the following text with reference to the drawings, in which:

FIG. 6 shows, by way of example, a schematic illustration of a connecting terminal element, FIG. 7 shows a plan view of a power semiconductor module with a connecting terminal element as shown in FIG. 6 fitted, but without a housing cover.

Mutually corresponding parts are provided with the same reference symbols in all the figures.

DETAILED DESCRIPTION OF THE EXAMPLE EMBODIMENTS

Figure 1:
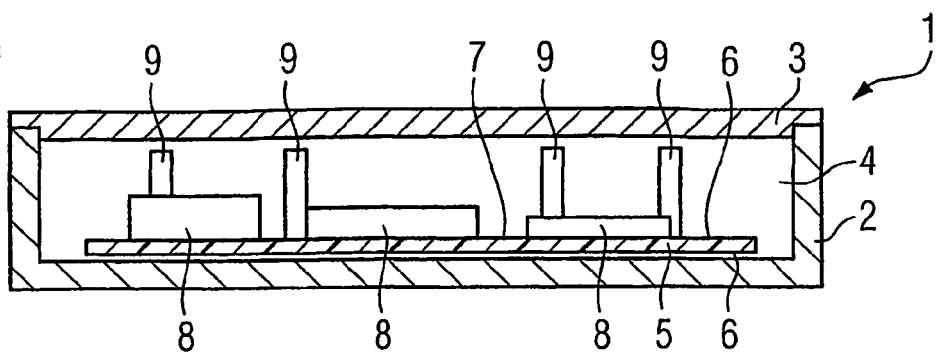
FIG. 1 shows a schematic cross section through a power semiconductor module with load connecting elements.
Figure 2:
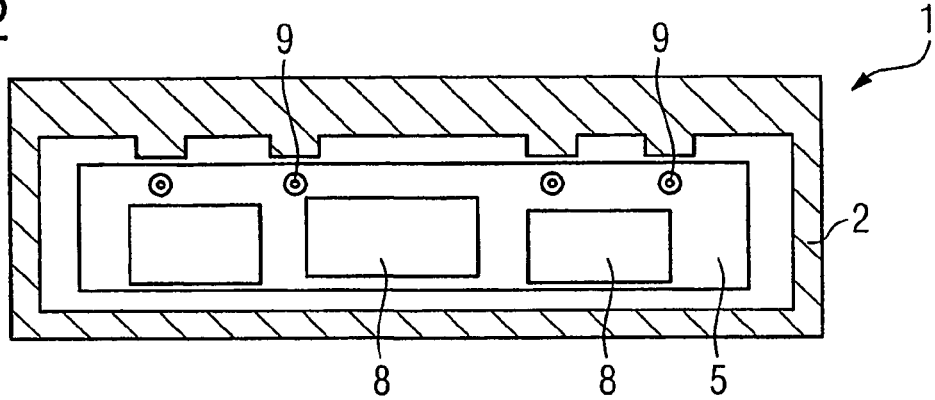
FIG. 2 shows a plan view of a power semiconductor module with load connecting elements but without a housing cover.

The power semiconductor module 1, which is illustrated schematically in the form of a cross section in FIG. 1 and in the form of a plan view in FIG. 2, includes a housing body 2 which is closed with a housing cover 3 and thus forms a housing interior 4. The housing body 2 and the housing cover 3 can be screwed to one another, can be plugged together or can be connected to one another in any other desired manner. A flat circuit mount 5 is located in the interior of the housing formed by the housing body 2 and the housing cover 3. The circuit mount 5 is provided on at least one of its two surfaces 6 with a metallized contact surface 7 (preferably copper) which is structured in accordance with the circuitry requirements (for example conductor tracks).

The circuit mount 5 may be either a ceramic circuit mount, such as a DCB circuit mount, or else a printed circuit board composed of plastic. Electronic components 8 are mechanically and electrically connected to the circuit mount 5. The electrical connection between the electronic component 8 and the circuit mount 5 can be produced by soldering. If the electronic component is a naked chip which can be fitted to a DCB circuit mount, the connections between the chip and the circuit mount 5 are made by bonding. Those connections of the power semiconductor module which lead to the exterior and are in general the load connections are connected via the circuitry structure of the circuit mount 5 at a suitable point on the surface 6 of the circuit mount 5. The load connecting elements 9 are mechanically and electrically connected, preferably by soldering, to the circuit mount 5 at this point. The load connecting element 9 is in this case preferably at right angles to the circuit mount 5, and projects through the housing interior 4 in the direction of the housing cover 3.

Figure 3:
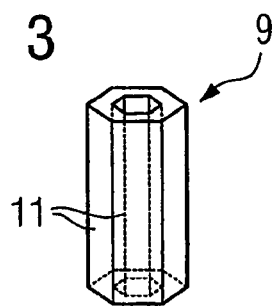
FIGS. 3, 4 show examples of forms of load connecting elements, in the form of a schematic illustration.
Figure 4:
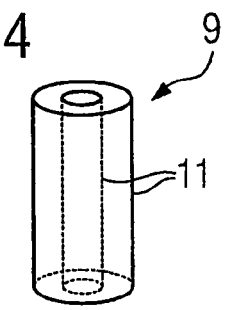

FIG. 3 shows a cylindrical load connecting element 9 with a hexagonal base surface geometry, and FIG. 4 shows a load connecting element 9 in the form of a circular cylinder. The two load connecting elements shown in FIG. 3 and FIG. 4 are in the form of hollow bodies, by way of example. Solid bodies and any other desired base surface geometries are feasible and may be worthwhile (current carrying capability, resistance to soldering). If the load connecting elements 9 advantageously comprise a ceramic body and are not composed of a solid conductive material, they have a metallized outer and/or inner casing surface 11.

Figure 5:
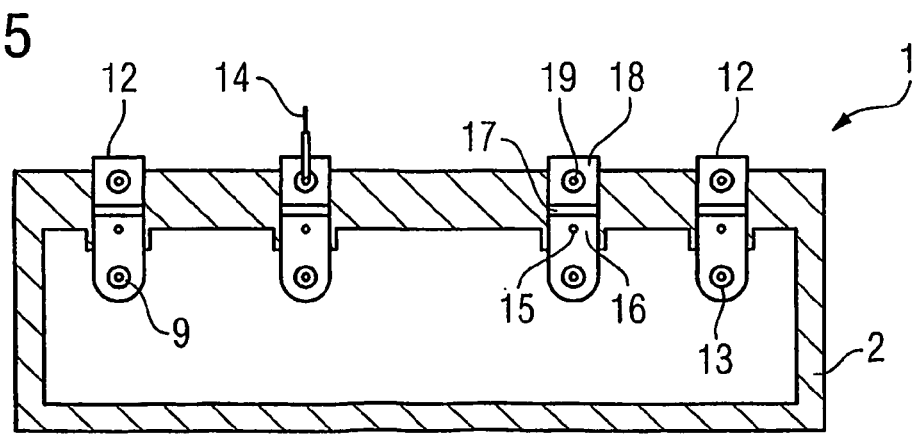
FIG. 5 shows a plan view of a power semiconductor module without a housing cover but with connecting terminal elements.

FIG. 5 shows a plan view of a power semiconductor module 1 without the housing cover 3 fitted but with connecting terminal elements 12 fitted for holding the external connection 14. The connecting terminal element 12 is placed over the load connecting element 9 and in one simple case comprises a cuboid rail piece with a plurality of bends or angles. Angles result in a first rail section 16, which runs virtually at right angles to the load connecting element in the installed state, a rail section 17 running approximately at right angles to this, and a rail section 18 which once again runs, in its extension, virtually parallel to the rail section 16.

In order to hold the load connecting element, the connecting terminal element 12 has a cutout 13 in the area of the first rail section 16, which cutout 13 corresponds to the base surface geometry of the load connecting element 9 and allows a force-fitting connection, which makes an electrically reliable contact, between the load connecting element 9 and the connecting terminal element 12. The connecting terminal element 12 is composed of an electrically conductive material, or its surface is at least metallized with an electrically conductive material. In the simplest case and in the case of circular-cylindrical load connecting elements 9, the cutout 13 may be an aperture or blind hole.

Figure 8:
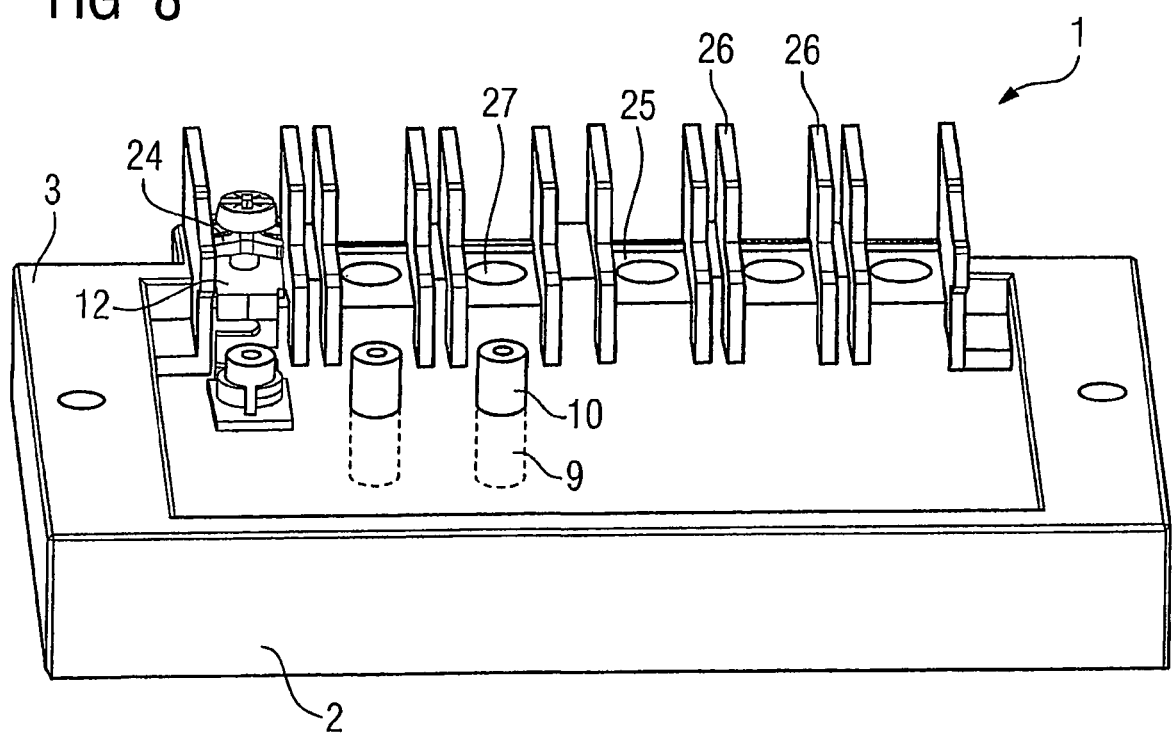
FIG. 8 shows a plan view of a power semiconductor module with a connecting terminal element as shown in FIG. 6 fitted, and with a housing cover.

The rail section 18 has a holding device 19 which holds the external connection 14. In the present case, a hole with an internal thread in it is provided as the holder device 19, by means of which the external connection 14 is screwed on. Any other desired contours of the holding devices 19 are feasible. Holding devices 15 are provided on the housing and on the connecting terminal element 12 and ensure that the connecting terminal element 12 is fixed in order to absorb forces and torques introduced from the external connection 14. In FIG. 5, the holding devices 15 is a screw connection arranged in the first rail section 16 between the connecting terminal element 12 and the housing body 2. Further holding devices are illustrated in FIGS. 7 and 8.

FIG. 6 shows a further embodiment of the connecting terminal element 12, which can likewise be split into rail sections 16, 17, 18. In this variant, a seat 20 in the form of a hollow cylinder is introduced into the cutout 13 in the connecting terminal element 12 in the first rail section 16 and ensures that an optimum contact is made with the circular load connecting element 9 in this exemplary embodiment. This seat 20 has a slot 21 on at least one side of its cylindrical wall. This slot 21 ensures that the circular opening of the seat 20 can be widened slightly in a manner which allows it to spring back, with the springing-back effect in the installed state resulting in better contact pressure between the seat 20 and the load connecting element 9.

In the rail section 18, there is once again a holding device 19 including a screw 22 and a hole with an internal thread 23 for holding the external connection 14, with the holding device 19 in this case having been widened by a quadrilateral plate 24 which allows force-fitting compression of the external connection 14. Two cutouts 28 in the form of elongated holes are provided in the rail section 17. When torsional forces are introduced on the external connection, this section is subject to rotation deflection in the directions illustrated by the double-headed direction arrow 29.

FIG. 7 shows a plan view of a power semiconductor module 1 with a housing. A connecting terminal element 12, explained in more detail in FIG. 6, is placed on a load connecting element 9. In order to support and fix the connecting terminal element 12 that has been fitted, the housing body 2 has a specifically shaped match 25 and walls 26 for each connecting terminal element, and these represent one example refinement of the abovementioned holding devices 15. The match 25 is a reinforced area in the material of the housing body 2, creating a contact or resting surface for the connecting terminal element 12 in the area of its rail sections 17 and 18. Furthermore, the match 25 has a blind hole 27 which allows the screw 22 that has been tightened to be countersunk in it, at the same time absorbing compression and tension from the external connection 14, which is not illustrated here.

The blind hole 27 may also have an internal thread which is at the same time responsible for holding the external connection 14 and the connecting terminal element itself. The walls 26 are vertical plate-like raised material areas which are integrally formed on the housing, in general, during plastic injection molding in the same process and are arranged at a distance from one another such that one connecting terminal element can be inserted with an accurate fit between two walls 26 in each case, essentially in the area of the rail sections 17 and 18. The walls 26 therefore fix the connecting terminal element 12 against lateral pressure, which can originate from the external connection 14. Furthermore, the walls 26 prevent rotation of the plate 24 and carry out isolation functions between adjacent connection terminal elements 12.

Based on FIG. 6 and FIG. 7, FIG. 8 shows a plan view of a power semiconductor module with a connecting terminal element fitted with the housing cover, with the load connecting element 9 in this case having a length such that it results in a projection 10 when the housing cover 3 is fitted, resulting in the load connecting element 9 extending beyond the fitted housing cover 3. The projections 10 on the three illustrated load connecting elements 9 pass through the fitted housing cover 3.

For this purpose, the housing cover 3 has apertures geometrically corresponding to the base surface contour of the load connecting element 9 and by which the load connecting elements 9 are additionally fixed once the housing cover 3 has been fitted, such that it is no longer possible for the load connecting element 9 to break off after assembly of the housing. In order to support and fix the fitted connecting terminal element 12, the housing cover 3 in this case has the specific holding device 15, as described above, for each connecting terminal element 12, in the form of an integrally formed match 25 and the walls 26, creating a contact or rest surface for the connecting terminal element 12 in the area of its rail sections 17 and 18.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A power semiconductor module comprising:
a housing that holds at least one essentially flat circuit mount, the circuit mount being provided with metallization on at least a part of a surface of the circuit mount and is fitted with and electrically connected to at least one power semiconductor, wherein a plurality of rigid, integral and essentially straight load connecting elements are fitted on the metallized part of the metallized surface of the circuit mount, are electrically and mechanically firmly connected at one end to the circuit mount and project essentially at right angles from the circuit mount into the housing interior, wherein separate connecting terminal elements that make electrical contact are fitted to the free end of the load connecting elements, and wherein the load connecting elements have a ceramic body with electrically conductively metallized casing surfaces.

2. The power semiconductor module as claimed in claim 1, wherein the load connecting elements are in the form of at least one of a cylinder, tube and rod and may have different base-surface geometries.

3. The power semiconductor module as claimed in claim 1, wherein the load connecting elements are at least one of soldered, adhesively bonded and welded by its base surface, in a free-standing form, to the circuit mount.

4. The power semiconductor module as claimed in claim 1, wherein the free end of at least one of the load connecting elements projects outwards through the housing, to hold a connecting terminal element for making electrical contact.

5. The power semiconductor module as claimed in claim 1, wherein at least one of the load connecting elements includes a metallized casing surface which is highly resistant to wear.

6. The power semiconductor module as claimed in claim 1, wherein the connecting terminal elements include a cutout, with a geometry and size of the cutout corresponding approximately to base-surface geometry and size of the free end of the corresponding load connecting element to be connected, such that, once the cutout in the connecting terminal element has been fitted to the free end of the load connecting element, there is a force-fitting connection between the connecting terminal elements and the load connecting elements.

7. The power semiconductor module as claimed in claim 6, wherein, in a holding area for the load connecting elements, the connecting terminal elements include at least one device which allows slight springing-back enlargement of the internal diameter of the cutout for fitting to the load connecting elements, with the forces which occur in the widened area as a result of the springing-back characteristic increasing the force fit of the connection between the connecting terminal elements and the load connecting elements.

8. The power semiconductor module as claimed in claim 1, wherein the housing and the connecting terminal elements are designed such that the connecting terminal elements are connectable to the housing with at least one of an interlock and a force fit to absorb force and torque from externally introduced forces, such that the forces which are introduced are essentially transmitted to the housing.

9. The power semiconductor module as claimed in claim 1, wherein the connecting terminal element includes at least one device to ensure a torsionally soft connection between rail sections of the connecting terminal element.

10. The power semiconductor module as claimed in claim 6, wherein the connecting terminal elements are detachable from the housing.

11. The power semiconductor module as claimed in claim 1, wherein, on a conductor connecting side, at least one connecting terminal element includes a holding device in the form of different, suitably designed at least one of holes and contours, which allow flexible connection of external connections, using various connecting techniques.

12. The power semiconductor module as claimed in claim 2, wherein the load connecting elements have different base-surface geometries.

13. The power semiconductor module as claimed in claim 2, wherein the load connecting elements are at least one of soldered, adhesively bonded and welded at a base surface, in a free-standing form, to the circuit mount.

14. The power semiconductor module as claimed in claim 5, wherein the metallized casing surface is comprised of palladium.

15. The power semiconductor module as claimed in claim 2, wherein at least one of the connecting terminal elements includes a cutout, with a geometry and size of the cutout corresponding approximately to base-surface geometry and size of the free end of the corresponding load connecting element to be connected, such that, once the cutout in the connecting terminal element has been fitted to the free end of the load connecting element, there is a force-fitting connection between the connecting terminal element and the load connecting element.

16. The power semiconductor module as claimed in claim 15, wherein, in the holding area for the load connecting element, the connecting terminal element includes at least one device which allows slight springing-back enlargement of the internal diameter of the cutout for fitting to the load connecting element, with the forces which occur in the widened area as a result of the springing-back characteristic increasing the force fit of the connection between the connecting terminal element and the load connecting element.

17. The power semiconductor module as claimed in claim 1, wherein the housing and the connecting terminal elements are designed such that the at least one of the connecting terminal elements is connectable to the housing with at least one of an interlock and a force fit to absorb force and torque from externally introduced forces, such that the forces which are introduced are essentially transmitted to the housing.

* * * * *